(12) United States Patent
Wang et al.

(10) Patent No.: US 6,541,187 B1
(45) Date of Patent: Apr. 1, 2003

(54) PROCESS FOR PRODUCING AN ARTICLE WITH A MICROSTRUCTURE

(75) Inventors: Ying-Fu Wang, Taipei (TW); Yi-Tang Wang, Taipei Hsien (TW)

(73) Assignee: Taiwan Nano Electro-Optical Technology Co., Ltd, Taipei (TW)

( * ) Notice: Subject to any disclaimer, the term of this patent is extended or adjusted under 35 U.S.C. 154(b) by 136 days.

(21) Appl. No.: 09/711,258

(22) Filed: Nov. 13, 2000

(30) Foreign Application Priority Data

Aug. 1, 2000 (TW) ........................................ 089115446

(51) Int. Cl.$^7$ ................................................. G03F 7/00
(52) U.S. Cl. ........................ 430/324; 430/320; 430/322
(58) Field of Search ................................ 430/320, 321, 430/322, 324

(56) References Cited

U.S. PATENT DOCUMENTS

| | | | |
|---|---|---|---|
| 4,723,903 A | 2/1988 | Okazaki et al. | 425/385 |
| 5,119,359 A | 6/1992 | Miyagi et al. | 369/109 |
| 5,347,510 A | 9/1994 | Hirokane et al. | 369/275.5 |
| 5,776,636 A | 7/1998 | Kunisawa et al. | 430/5 |
| 5,961,198 A | 10/1999 | Hira et al. | 362/31 |
| 6,020,215 A | 2/2000 | Yagi et al. | 438/52 |

*Primary Examiner*—Kathleen Duda
(74) *Attorney, Agent, or Firm*—Merchant & Gould P.C.

(57) ABSTRACT

A process for producing an article with a microstructure includes the steps of forming a primary relief structure on a surface of a substrate, applying a photo resist on the substrate, exposing part of the photo resist using a photo mask so as to form a microstructure pattern, developing the microstructure pattern in the exposed photo resist, thereby allowing access to a part of the primary relief structure from the photo resist, and thereby forming a patterned surface with a microstructure relief that is bounded by the exposed part of the primary relief structure and by remainder of the photo resist on the substrate, and forming a metal layer on the patterned surface to form the article having the microstructure with a profile corresponding to the microstructure relief on the patterned surface.

18 Claims, 18 Drawing Sheets

PROCESS FOR PRODUCING AN ARTICLE WITH A MICROSTRUCTURE

BACKGROUND OF THE INVENTION

1. Field of the Invention

The present invention relates to a process for producing an article with a microstructure, more particularly to a process which permits production of an article having a microstructure with a relatively complex profile, with a relatively high degree of form accuracy, and with high surface smoothness, and to an article produced by the process.

2. Description of the Related Art

Many methods are available in the art to produce an article, such as a light transmitting plate, having a patterned surface with a relief microstructure. This article is formed using a stamper or a mold having a reversed pattern of the relief microstructure. U.S. Pat. No. 5,776,636 discloses a method for manufacturing light-transmitting plates, which method includes the steps of forming a photo resist layer on a flat substrate, exposing the photo resist so as to form a deflection pattern in the photo resist, developing the exposed photo resist to form a topographical relief in the photo resist corresponding to the deflection pattern, metallizing and electro forming the surface of the photo resist to thereby form a stamper, and injection molding the light-transmitting plate using the stamper. It is possible to expose the deflection pattern using parallel light beams irradiated on the photo resist layer through an over-laid photo mask. In this case, the sectional configuration of the topographical relief is usually rectangular or trapezoidal. It is also possible to directly draw the pattern on the photo resist using an optical beam. In this case, the configuration of the topographical relief can be modified by adjusting exposure conditions and/or by adding a baking step between the developing and metallizing steps. This results in added procedures in the manufacturing process of the light transmitting plate. Moreover, it is difficult in the aforementioned method to form a topographical relief with a complex profile and with high surface smoothness and a relatively high degree of form accuracy.

SUMMARY OF THE INVENTION

Therefore, the main object of the present invention is to provide to a process for producing an article with a microstructure having a relatively complex microstructure pattern and high surface smoothness and at a relatively high degree of form accuracy, and to an article produced by the process.

Accordingly, the process of the present invention includes the steps of forming a primary relief structure on a surface of a substrate, applying a photo resist onthe substrate, exposing part of the photo resist using a photo mask so as to form a microstructure pattern, developing the microstructure pattern in the exposed photo resist, thereby allowing access to a part of the primary relief structure from the photo resist, and thereby forming a patterned surface with a microstructure relief that is bounded by the exposed part of the primary relief structure and by remainder of the photo resist on the substrate, and forming a metal layer on the patterned surface to form the article having the microstructure with a profile corresponding to the microstructure relief on the patterned surface.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
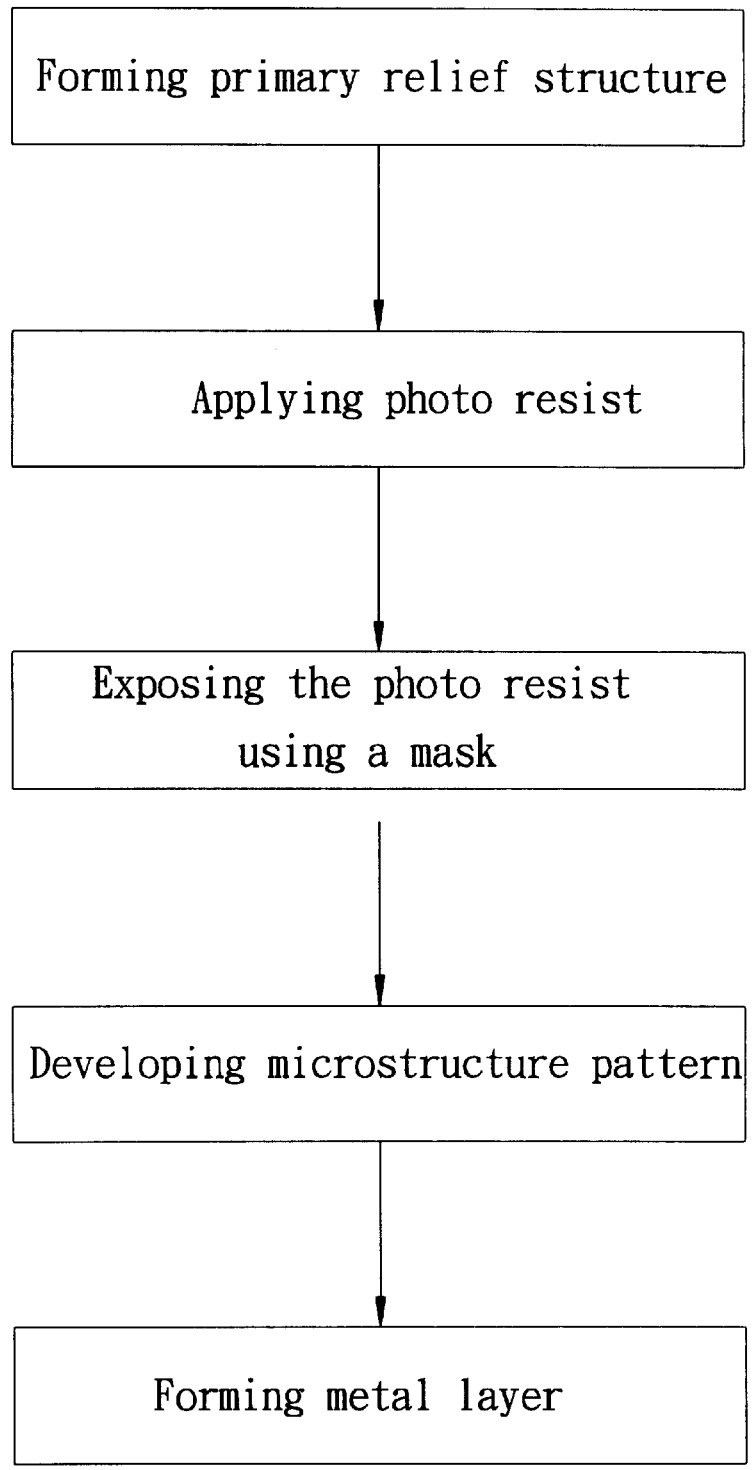
FIG. 1 is a flow chart illustrating the process according to the present invention.

Before the present invention is described in greater detail, it should be noted that like elements are denoted by the same reference numerals throughout the disclosure.

The process for manufacturing an article with a microstructure according to the present invention will now be described in more detail. FIG. 1 is a flow chart illustrating the process of the present invention.

Figure 4:
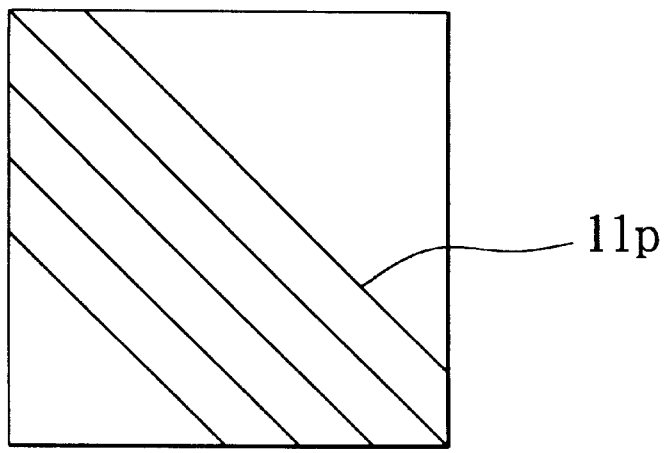
FIG. 4 is a top plan view illustrating a substrate formed with a parallel set of linear relief structures that are displaced from one another at equal distances.
Figure 5:
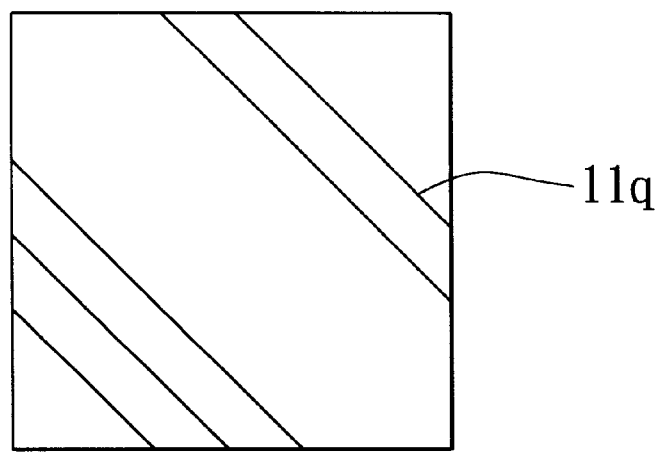
FIG. 5 is a top plan view illustrating a substrate formed with a parallel set of linear relief structures that are displaced from one another at different distances.
Figure 6:
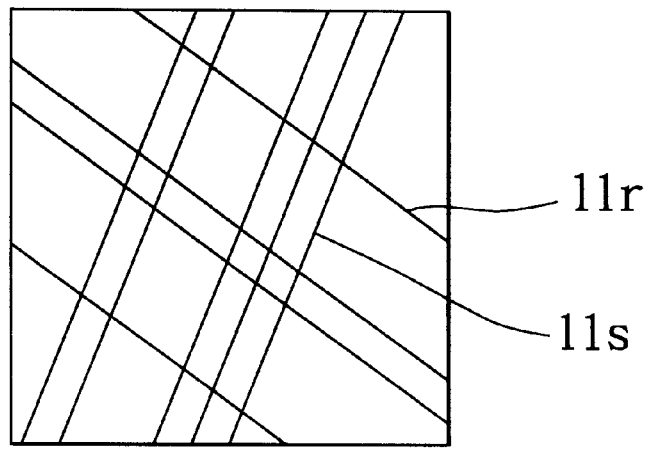
FIG. 6 is a top plan view illustrating a substrate formed with first and second sets of linear relief structures that intersect each other.
Figure 7:
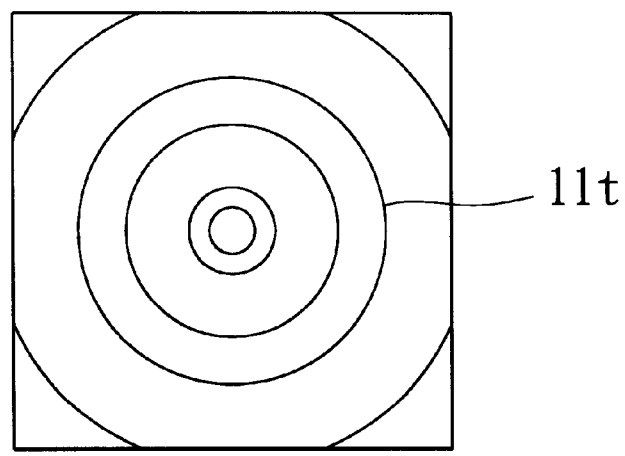
FIG. 7 is a top plan view illustrating a substrate formed with a set of concentric circular relief structures.
Figure 8:
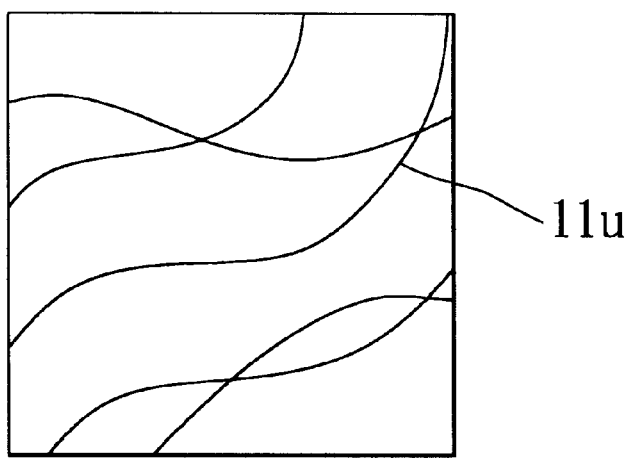
FIG. 8 is a top plan view illustrating a substrate formed with a set of curved relief structures.

A substrate is formed with a primary relief structure on a top surface thereof. The primary relief structure may be recessed relative to the top surface of the substrate, or may project relative to the top surface of the substrate. The shape of the primary relief structure is not limited. For instance, the relief structure may be in the form of recessions 11a, 11b, 11c, 11d, 11e, 11f, 11g, 11h, and 11i, as shown in FIGS. 2(A) to 2(I), or in the form of projections 11j, 11k, 11m, 11n, as shown in FIGS. 3(A) to 3(D). The primary relief structure may include a parallel set of linear structures 11p, 11q which are equally or non-equally displaced from one another, as shown in FIGS. 4 and 5. Furthermore, the primary relief structure may include a parallel set of first linear structures 11r and a parallel set of second linear structures 11s that intersect the set of first linear structures 11r, as shown in FIG. 6. Alternatively, the primary relief structure may include a set of concentric circular structures 11t, as shown in FIG. 7. Moreover, the primary relief structure may also include a set of randomly distributed curved structures 11u, as shown in FIG. 8.

The substrate is made from a material selected from the group consisting of metal, glass, ceramic, and plastic. The substrate may be an original work piece, or an article formed from the original work piece via one or more casting steps.

The primary relief structure maybe formed by cutting, such as by diamond cutting, drilling, milling or other known techniques. When the primary relief structure has high form accuracy and high surface smoothness, the resulting microstructure will similarly have high form accuracy and an even mirror surface with a high surface smoothness.

Figure 2A:
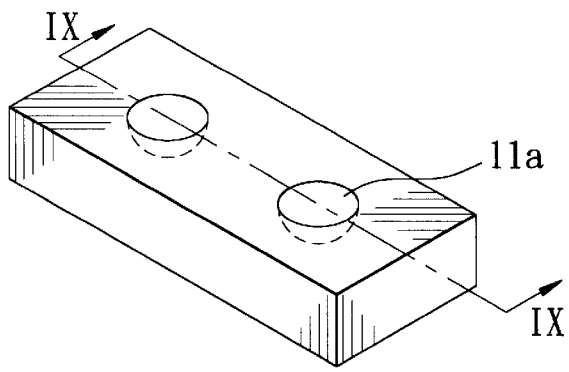
FIGS. 2(A)–2(I) are perspective views illustrating substrates formed with recessed primary relief structures for use in the process of the present invention.
Figure 2B:
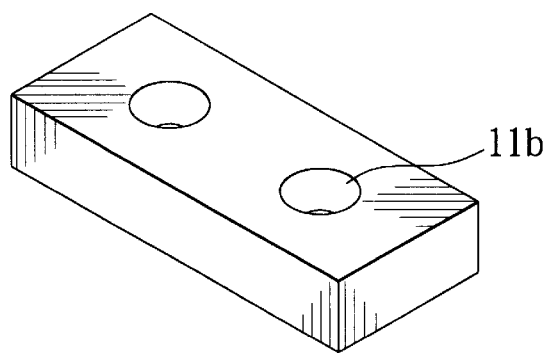
Figure 2C:
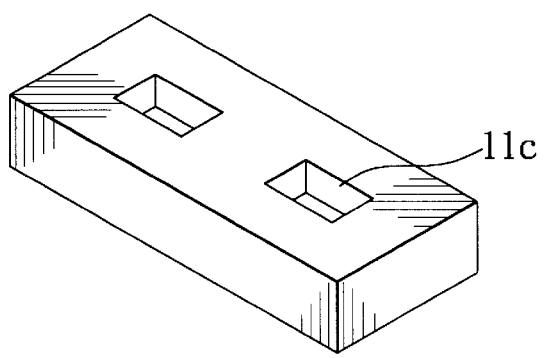
Figure 2D:
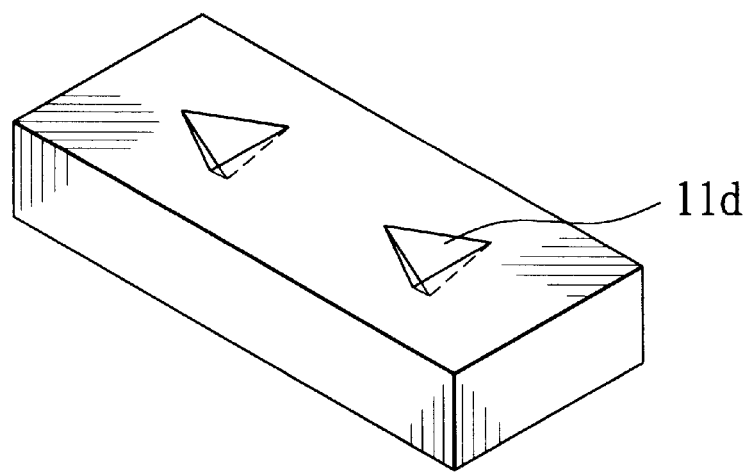
Figure 2E:
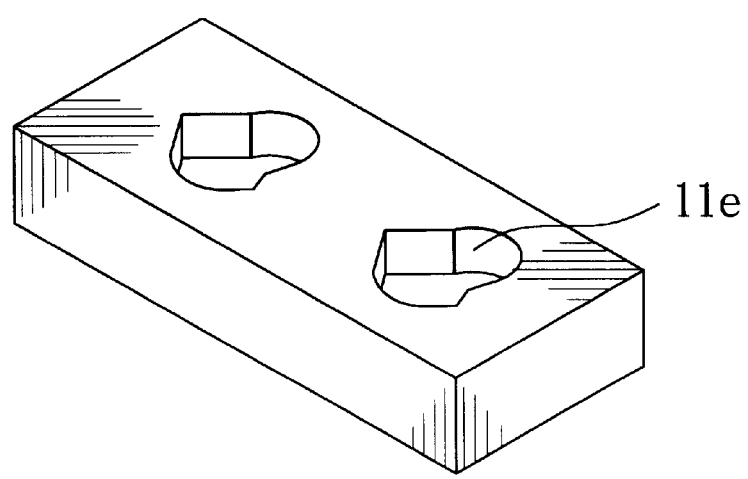
Figure 2F:
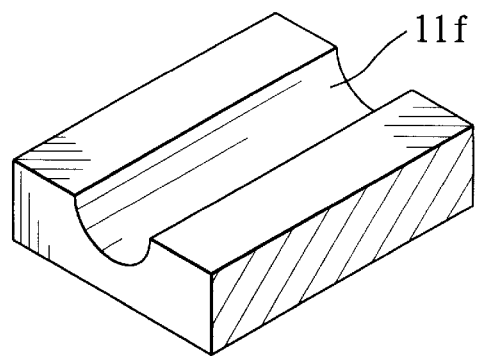
Figure 2G:
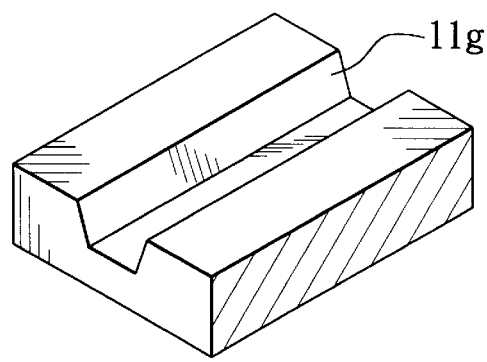
Figure 2H:
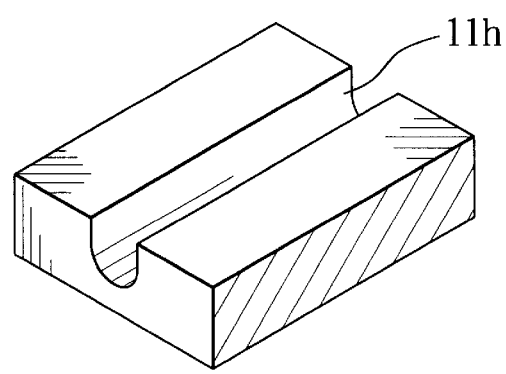
Figure 9:
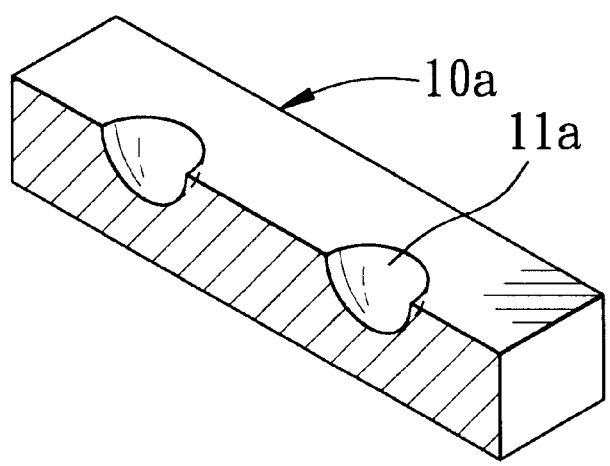
FIG. 9 is a cross-sectional view of the substrate shown in FIG. 2(A)
Figure 10:
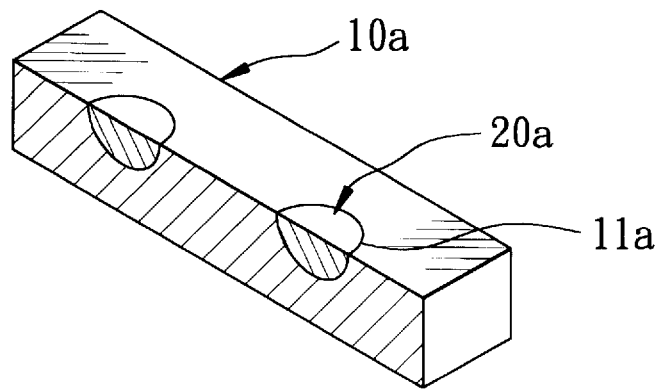
FIG. 10 is a cross-sectional view showing the substrate of FIG. 9 when applied with a photo resist according to the first preferred embodiment of the process of the present invention.

In the first preferred embodiment of the process according to the present invention, the primary relief structure is in the form of semi-spherical recessions 11a shown in FIG. 2(A). Referring to FIGS. 9 and 10, after the primary relief structure 11a is formed on the substrate 10a, a photo resist 20a is applied on the substrate 10a to fill up the primary relief structure 11a such that a surface of the photo resist 20a is flush with the top surface of the substrate 10a. However, according to the present invention, it is not necessary for the photo resist 20a to be flush with the top surface of the substrate 10a.

Figure 11:
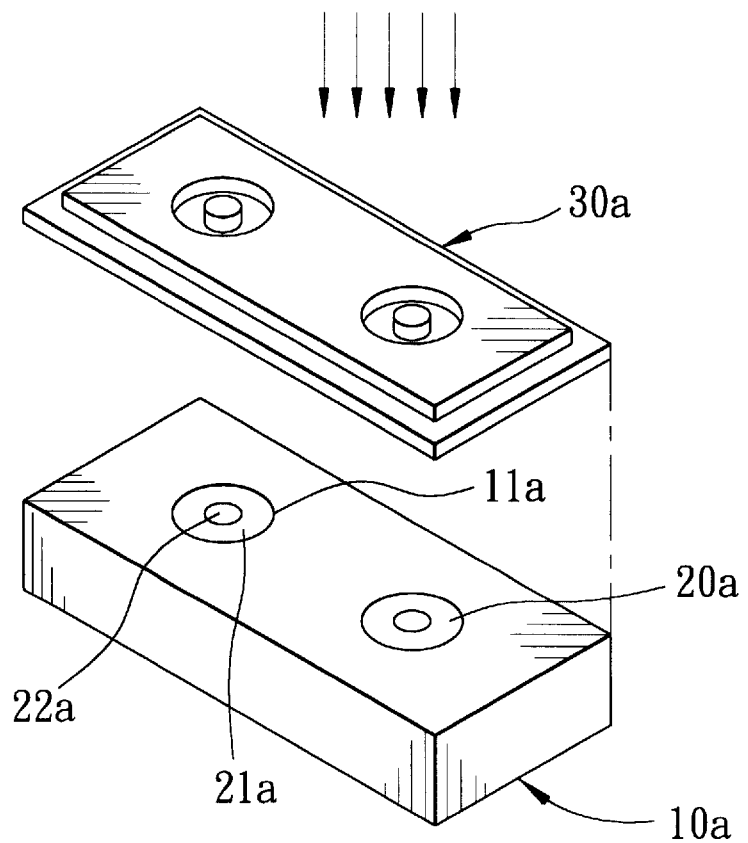
FIG. 11 is a perspective view illustrating an exposure step of the process of the first preferred embodiment.

Referring to FIG. 11, the photo resist 20a is then exposed using a photo mask 30a lying over the substrate 10a so as to form a microstructure pattern registered with the primary relief structure 11a in a direction that is transverse to the top surface of the substrate 10a. The photo mask 30a is formed with patterns in accordance with the requirements, such as size and distribution, of the microstructure of the article to be produced. The photo resist 20a may be formed by spin coating, dip coating, roll coating, etc, through one or more processing steps. Alternatively, a photo resist film may be used in the present invention. There are positive and negative photo resists, and either of them may be used in the present invention.

Figure 12:
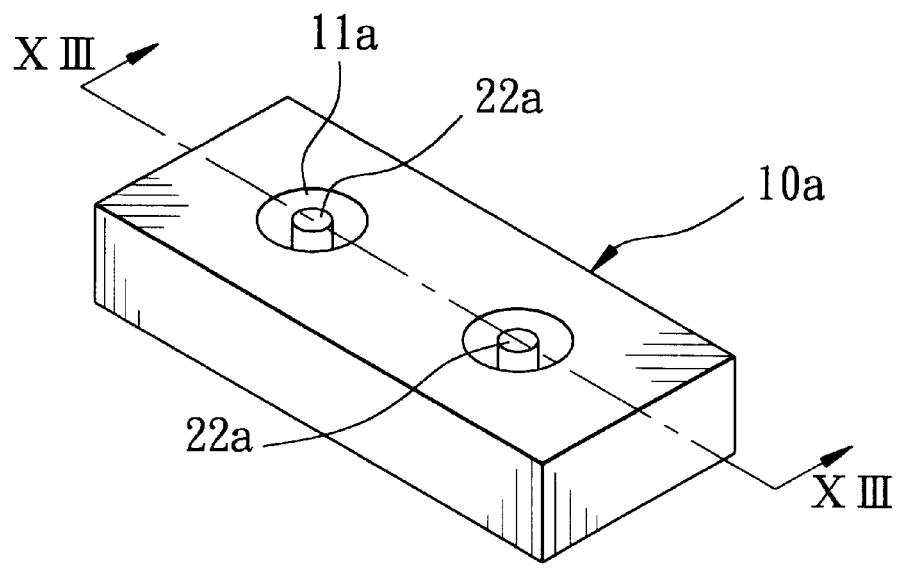
FIG. 12 is a perspective view showing the result after a developing step of the process of the first preferred embodiment.
Figure 13:
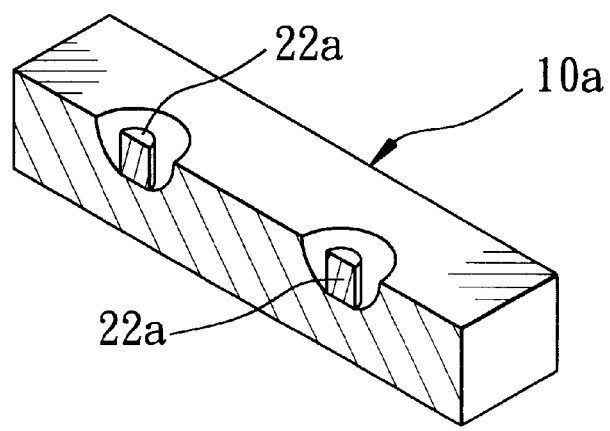
FIG. 13 is a cross-sectional view of FIG. 12.

After the exposure step, the microstructure pattern in the exposed photo resist 20a is developed, thereby allowing access to a part of the primary relief structure 11a from the photo resist 20a, and thereby forming a patterned surface with a microstructure relief that is bounded by the exposed parts of the primary relief structure 11a and by the remaining unexposed parts 22a of the photo resist 20a on the substrate 10a, as shown in FIGS. 12 and 13. In case a positive photo resist is used, the exposed parts 21a of the photo resist 20a are removed during the developing step, with the remaining unexposed parts 22a of the photo resist 20a being left on the substrate 10a, as with the present embodiment. Accordingly, with a negative photo resist, the unexposed parts are removed, whereas the exposed parts are left on the substrate.

Figure 14:
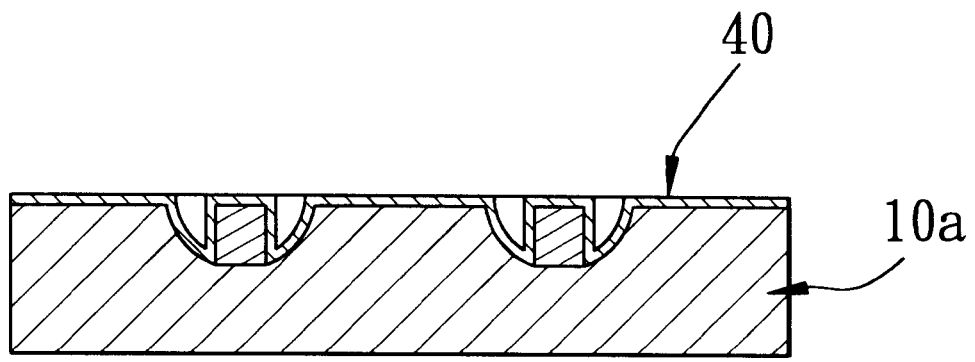
FIG. 14 is a cross-sectional view showing the result after a metallizing step of the process of the first preferred embodiment.
Figure 15:
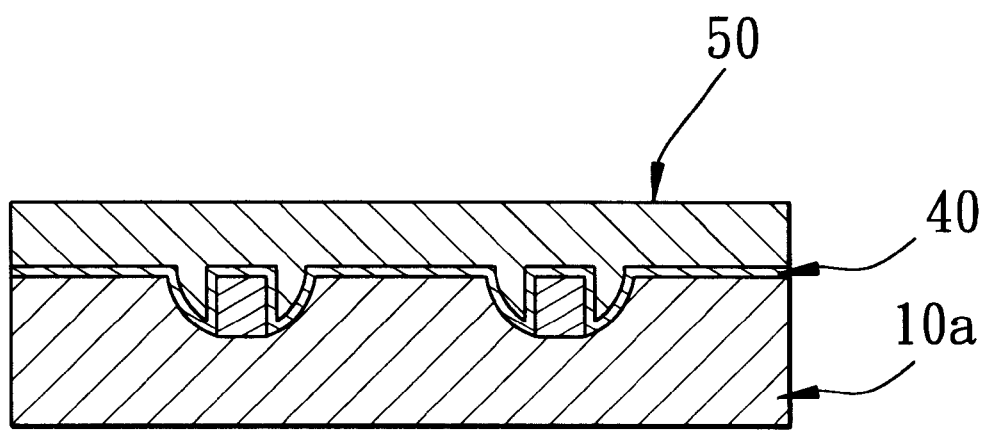
FIG. 15 is a cross-sectional view showing the step of electroforming a metal product according to the process of the first preferred embodiment.
Figure 16:
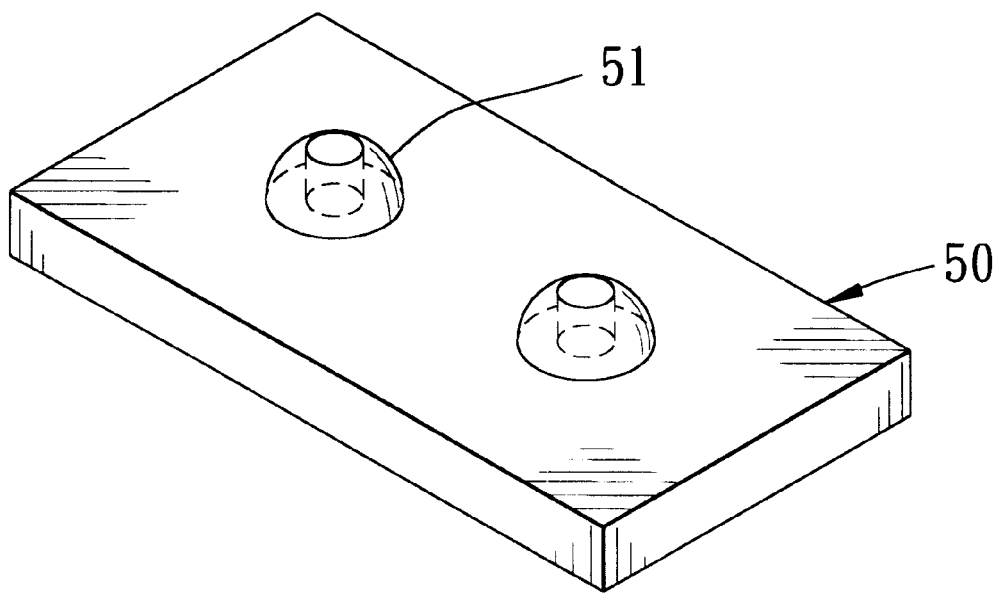
FIG. 16 is a perspective view illustrating the metal product formed in the step of FIG. 15.

After the developing step, a metal layer 40 is formed on the patterned surface so as to form an article having the microstructure with a profile corresponding to the microstructure relief on the patterned surface, as shown in FIG. 14. Metallization is conducted using known techniques, such as vacuum deposition, sputtering, etc. Thereafter, as shown in FIG. 15, a metal product 50 is formed on the metal layer 40 by electroforming or by non-electric plating. The metal product 50 is then stripped, and has a microstructure 51 with a profile that is the inverse of the microstructure relief on the patterned surface, as shown in FIG. 16. The metal product 50 may be directly used, for example, as a light reflective plate or a light diffusing plate. Alternatively, the metal product 50 may be used as a mold or a stamper to reproduce a metal or plastic product by known casting or molding processes.

Since the primary relief structure 11a on the substrate 10a can be formed to have high form accuracy, high surface smoothness, and a relatively complex shape, such as by the known diamond cutting techniques, and since the microstructure 51 on the metal product 50 is transferred from at least a part of the primary relief structure 11a, the microstructure 51 on the metal product 50 can thus be made to have higher form accuracy, higher surface smoothness, and a highly complicated shape when compared with those produced by the conventional methods, such as etching, photo-lithography, and energy processing. The diversity in the size or length of the microstructure 51 and the distribution of the microstructure 51 on the metal product 50 is difficult to achieve using a conventional processing method, such as by diamond cutting, in which intermittent cutting is difficult to perform.

Depending on the final use, such as for use as a master or a stamper, the metal product 50 having the microstructure 51 can be trimmed to a proper dimension, or flattened on its back by grinding or polishing.

If necessary, a plurality of products may be formed by repeating the electroforming process using the metal product 50. Each of the products can thus have a microstructure that corresponds to or that is the inverse of the microstructure relief on the patterned surface.

The metal product 50 produced in accordance with the present invention can be used as a backlighting plate in a liquid crystal display device for transforming a point light source (such as a light emitting diode) or a line light source (such as cold cathode fluorescent lamp) into a surface light source. It is desirable that the light emitted from the surface light source has high luminance and high uniformity, which are highly related to the shape, the surface smoothness and the form accuracy of the microstructure on the backlighting plate.

Figure 2I:
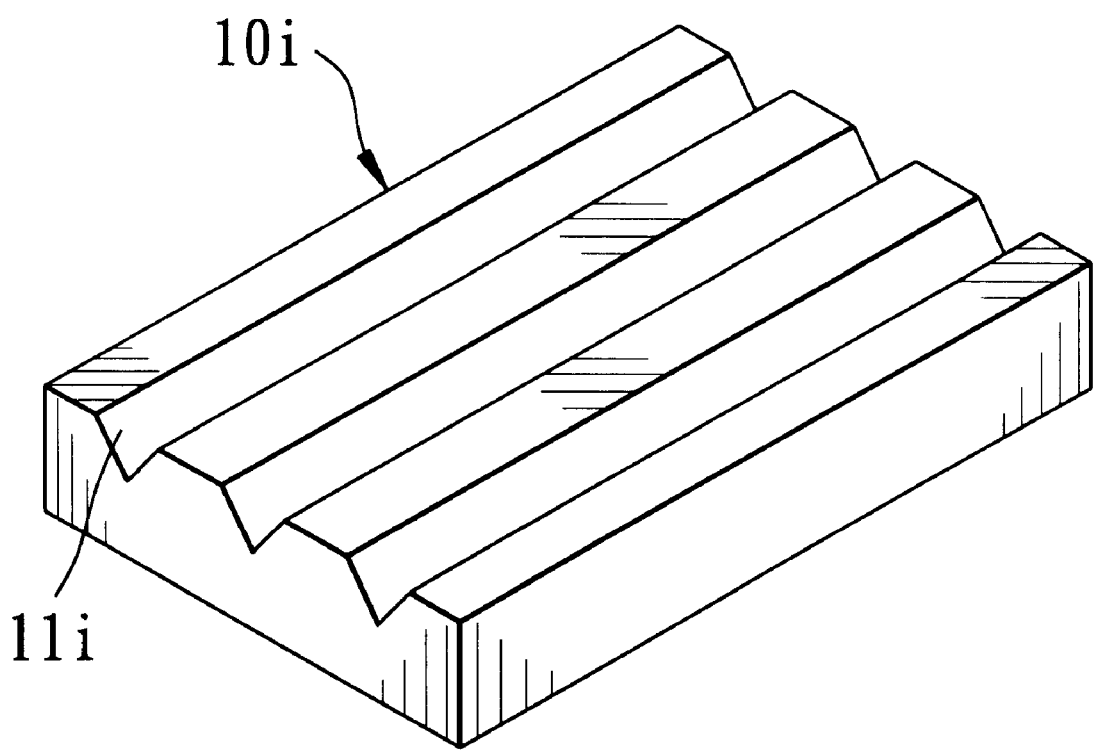
Figure 3A:
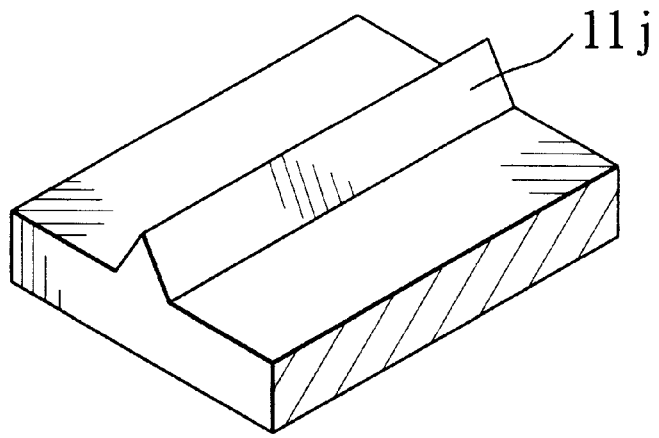
FIGS. 3(A)–3(D) are perspective views illustrating substrates formed with projecting primary relief structures for use in the process of the present invention.
Figure 3B:
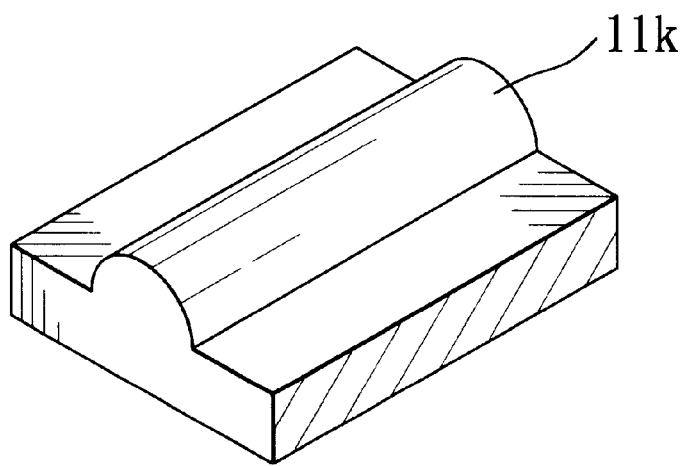
Figure 3C:
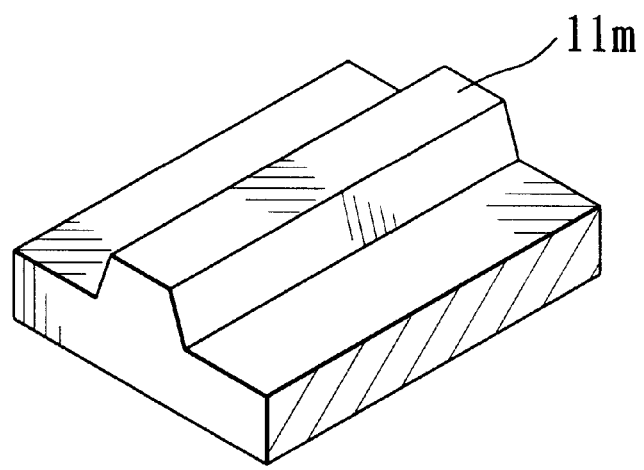
Figure 3D:
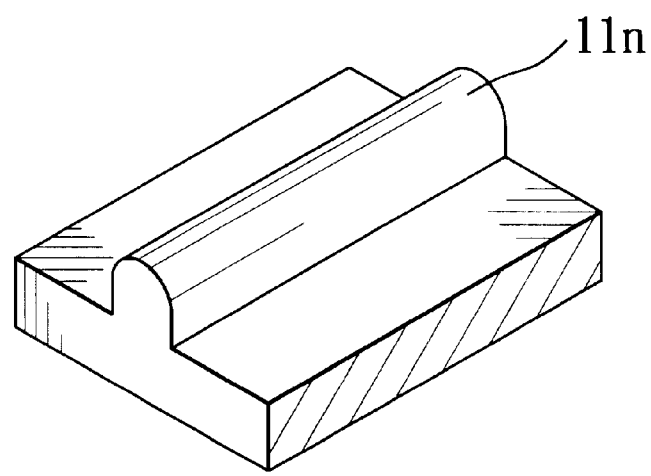
Figure 17:
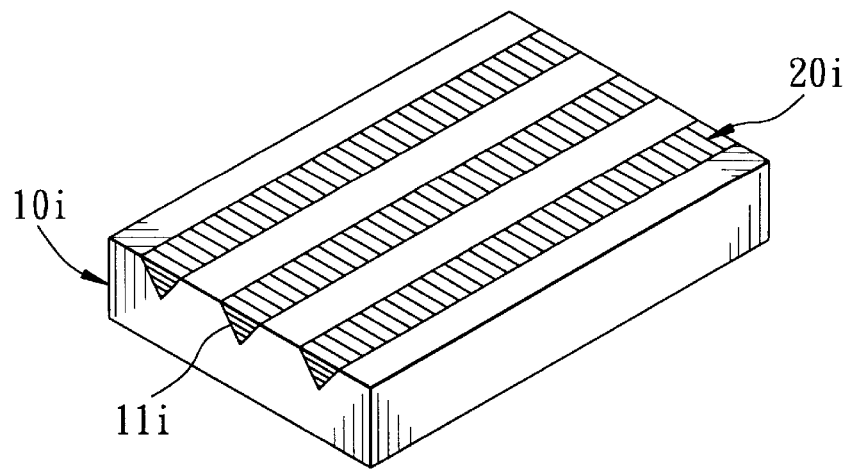
FIG. 17 is a perspective view illustrating the substrate of FIG. 2(I) after being applied with a photo resist according to the second preferred embodiment of the present invention.
Figure 18:
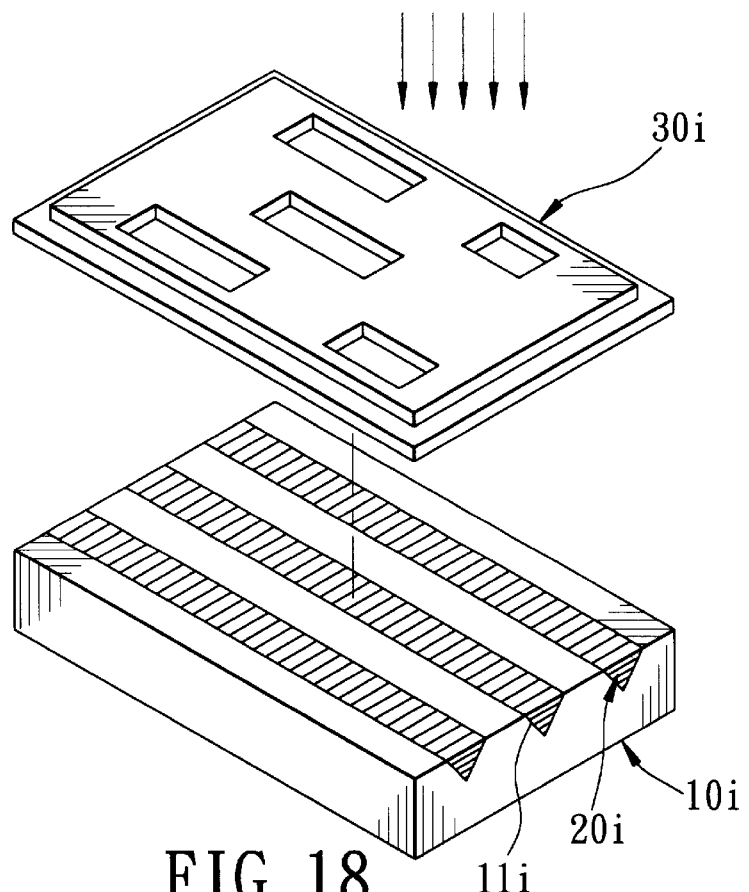
FIG. 18 is a perspective view illustrating an exposure step of the process of the second preferred embodiment.
Figure 19:
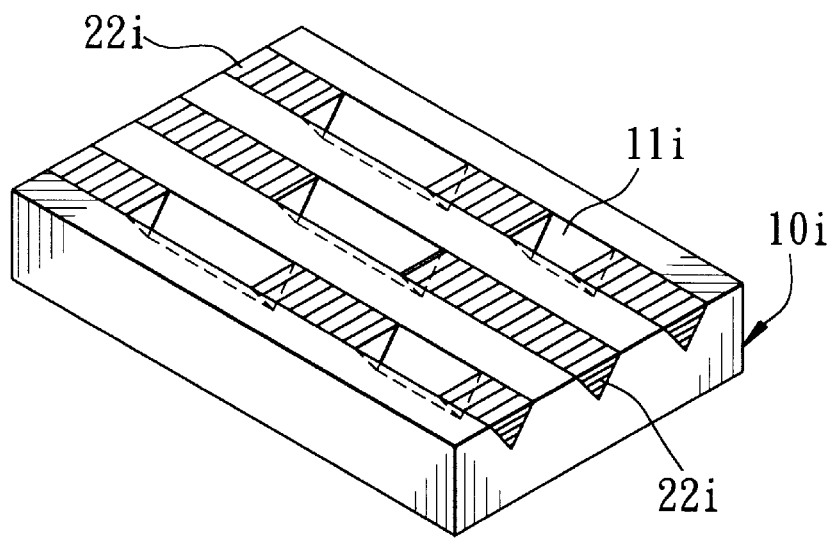
FIG. 19 is a perspective view showing the result after a developing step of the process of the second preferred embodiment.
Figure 20:
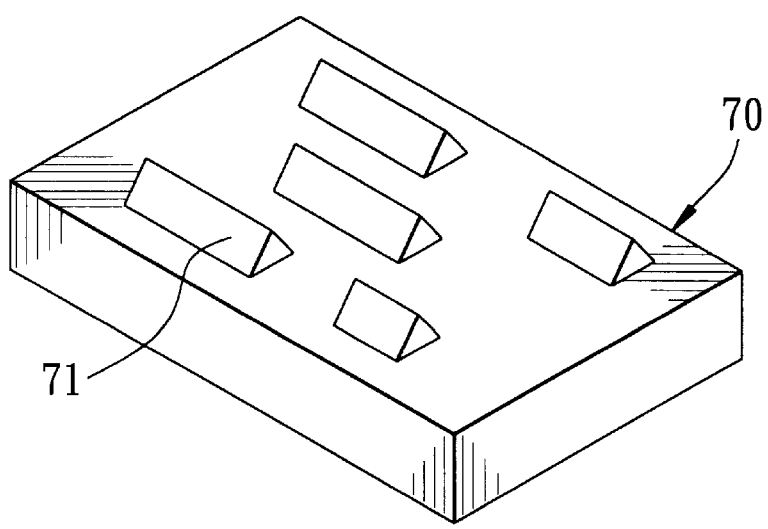
FIG. 20 is a perspective view illustrating a stamper formed from the process of the second preferred embodiment.

In the second preferred embodiment of the process according to the present invention, the primary relief structure 11i is in the form of aparallel set of elongated grooves with V-shaped cross-sections, as shown in FIG. 2(I). The primary relief structure 11i is formed on the substrate 10i by known diamond cutting techniques, and has high form accuracy and high surface smoothness. Referring to FIG. 17, according to the second preferred embodiment, a photo resist 20i is applied on the substrate 10i to fill up the primary relief structure 11i such that a surface of the photo resist 20i is flush with the top surface of the substrate 10i. Referring to FIG. 18, the photo resist 20*i* is then exposed using a photo mask 30*i* lying over the substrate 10*i*, and is then developed to allow access to a part of the primary relief structure 11*i* from the photo resist 20*i*, and to leave the remaining unexposed parts 22*i* of the photo resist 20*i* on the substrate 10*i*, as shown in FIG. 19. An electrically conducting metal layer is formed on the patterned surface thus formed, and a stamper 70, as shown in FIG. 20, is subsequently formed by electroforming. The stamper 70 has a microstructure 71 which has high form accuracy and good surface smoothness since it was transferred from the primary relief structure 11*i* initially formed on the substrate 10*i*. Thereafter, a light transmitting plate, such as a backlighting plate, a light guiding plate or a front lighting plate, having a microstructure with high form accuracy and good surface smoothness can be produced by injection molding using the stamper 70.

Figure 21A:
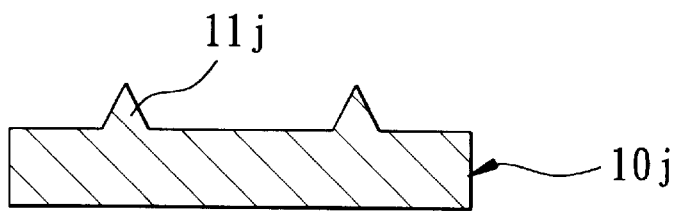
FIGS. 21(A)–21(F) illustrate the process of a third preferred embodiment according to the present invention.
Figure 21B:
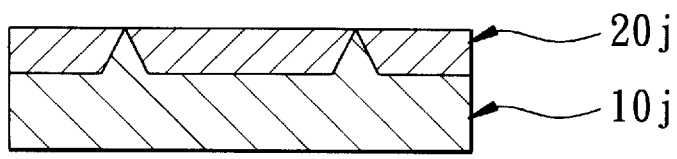
Figure 21C:
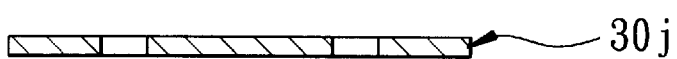
Figure 21C:
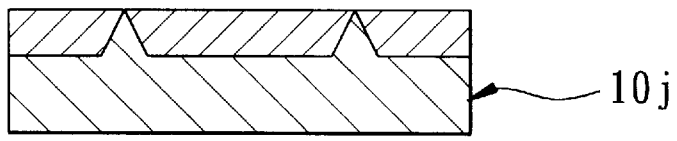
Figure 21D:
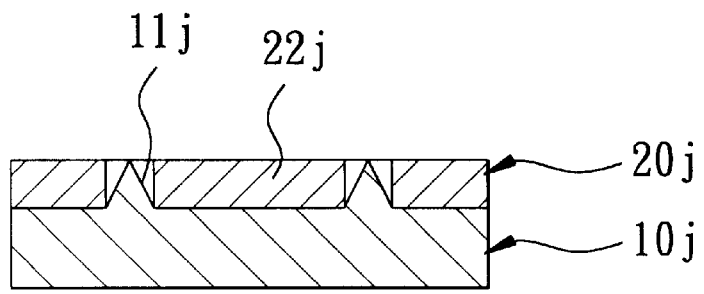
Figure 21E:
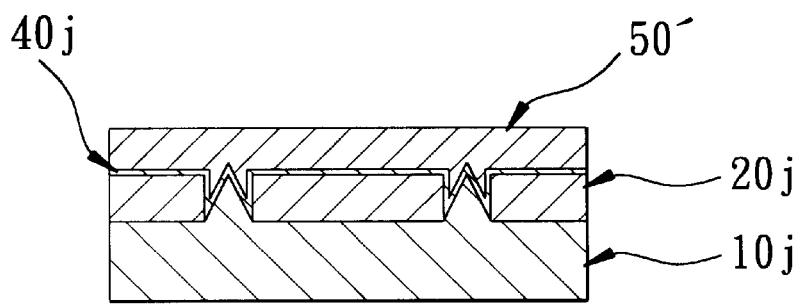
Figure 21F:
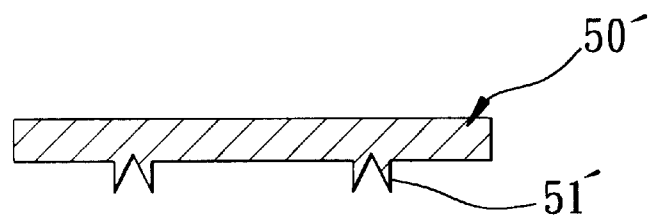

In the third preferred embodiment, the primary relief structure 11*j* is in the form of projections with triangular cross-sections, as shown in FIG. 21(A). A photo resist 20*j* is applied on the substrate 10*j* such that the primary relief structure 11*j* is embedded therein, as shown in FIG. 21(B). Thereafter, the photo resist 20*j* is exposed using a photo mask 30*j* lying over the substrate 10*j*, as shown in FIG. 21(C), and is then developed to remove the exposed part of the photo resist 20*j*, to allow access to a part of the primary relief structure 11*j* from the photo resist 20*j*, and to leave the remaining unexposed part 22*j* of the photo resist 20*j* on the substrate 10*j*, thereby forming a patterned surface with a microstructure relief which is bounded by the exposed part of the primary relief structure 11*j* and by the remaining unexposed part 22*j* of the photo resist on the substrate 10*j*. Thereafter, as with the method of the previous embodiment, a metal layer 40*j* is formed on the patterned surface, and a metal product 50' is then formed on the metal layer 40*j* by electroforming, as shown in FIG. 21(E). The metal product 50' is subsequently stripped off, as shown in FIG. 21(F). The metal product 50' has a microstructure 51' with a profile which is the inverse of the microstructure relief on the patterned surface of FIG. 21(D).

It has thus been shown that the process according to the present invention permits production of a product with a microstructure which has high form accuracy and high surface smoothness, and which can be complex in shape. The product may be used directly, or may be used for reproducing other articles.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A process for producing an article with a microstructure, comprising the steps of:

a) forming a primary relief structure on a surface of a substrate;

b) applying a photo resist on the substrate;

c) exposing part of the photo resist using a photo mask so as to form a microstructure pattern; and d) developing the microstructure pattern in the exposed photo resist, thereby allowing access to a part of the primary relief structure from the photo resist, and thereby forming a patterned surface with a microstructure relief that is bounded by the exposed part of the primary relief structure and by remainder of the photo resist on the substrate.

2. The process of claim 1, wherein the substrate is made of a material selected from the group consisting of metal, glass, ceramic and plastic.

3. The process of claim 1, wherein the primary relief structure includes a parallel set of first linear structures.

4. The process of claim 3, wherein the primary relief structure further includes a parallel set of second linear structures that intersect said set of first linear structures.

5. The process of claim 1, wherein the primary relief structure includes a set of concentric circular structures.

6. The process of claim 1, wherein the primary relief structure includes a set of curved structures.

7. The process of claim 1, wherein the primary relief structure includes at least one of a set of linear structures and a set of curved structures.

8. The process of claim 1, wherein, in step (a), the primary relief structure is formed by diamond cutting.

9. The process of claim 1, wherein the primary relief structure is recessed relative to the surface of the substrate.

10. The process of claim 9, wherein, in step (b), the photo resist is disposed on the primary relief structure.

11. The process of claim 10, wherein, in step (b), the photo resist is applied on the substrate such that a surface of the photo resist is flush with the surface of the substrate.

12. The process of claim 1, wherein the primary relief structure projects from the surface of the substrate.

13. The process of claim 1, further comprising the step of:

e) forming a metal layer on the patterned surface to form the article having the microstructure with a profile corresponding to the microstructure relief on the patterned surface.

14. The process of claim 13, further comprising the step of:

(f) forming a metal product on the metal layer such that the metal product has a microstructure with a profile that is the inverse of the microstructure on the article.

15. The process of claim 14, wherein, in step (f), the metal product is formed by electroforming.

16. The process of claim 14, wherein, in step (f), the metal product is formed by non-electric plating.

17. The process of claim 14, wherein the metal product is a stamper or mold that is used to produce a product via metal casting.

18. The process of claim 14, wherein the metal product is a stamper or mold that is used to produce a product via plastic molding.

\* \* \* \* \*